United States Patent [19]

Shadan et al.

[11] Patent Number: 5,893,929

[45] Date of Patent: Apr. 13, 1999

[54] MUTUALLY CONTROLLED MATCH-LINE-TO-WORD-LINE TRANSFER CIRCUIT

[75] Inventors: H. Victor Shadan, Santa Clara; Anurag Nigam, Mountain View, both of Calif.

[73] Assignee: Intel Corporation, Santa Clara, Calif.

[21] Appl. No.: 08/639,555

[22] Filed: Apr. 29, 1996

[51] Int. Cl.$^6$ ............................................. G06F 12/08
[52] U.S. Cl. ............................ 711/205; 711/206; 711/207; 711/108; 711/128; 365/49; 365/230.06
[58] Field of Search ........................... 395/435, 473, 395/415, 455, 403; 365/49, 230.06; 711/3, 207, 108, 128, 146

[56] References Cited

U.S. PATENT DOCUMENTS

| | | | |
|---|---|---|---|
| 4,559,618 | 12/1985 | Houseman et al. | 365/49 |
| 5,299,147 | 3/1994 | Hoist | 365/49 |
| 5,396,448 | 3/1995 | Takayanagi et al. | 365/49 |
| 5,602,770 | 2/1997 | Ohira | 365/49 |
| 5,602,795 | 2/1997 | Sandhu | 365/230.06 |
| 5,617,348 | 4/1997 | Maguire | 365/49 |
| 5,640,534 | 6/1997 | Liu et al. | 711/146 |

Primary Examiner—Eddie P. Chan
Assistant Examiner—Than V. Nguyen
Attorney, Agent, or Firm—Blakely, Sokoloff, Taylor & Zafman LLP

[57] ABSTRACT

A circuit for transferring a logic value from a content addressable memory (CAM) having a plurality of match lines to a random access memory (RAM) having a plurality of word lines. A first logic gate has an input coupled to a first match line of the plurality of match lines, and a second logic gate has an input coupled to a second match line of the plurality of match lines. A first switch is coupled between an output of the first logic gate and a first word line, and a second switch is coupled between an output of the second logic gate and a second word line. The first switch is controlled by the output of the second logic gate such that the first switch is opened when the second match line has a second logic value and closed when the second match line has a first logic value. The second switch is controlled by the output of the first logic gate such that the second switch is opened when the first match line has the second logic value and closed when the first match line has the first logic value.

13 Claims, 6 Drawing Sheets

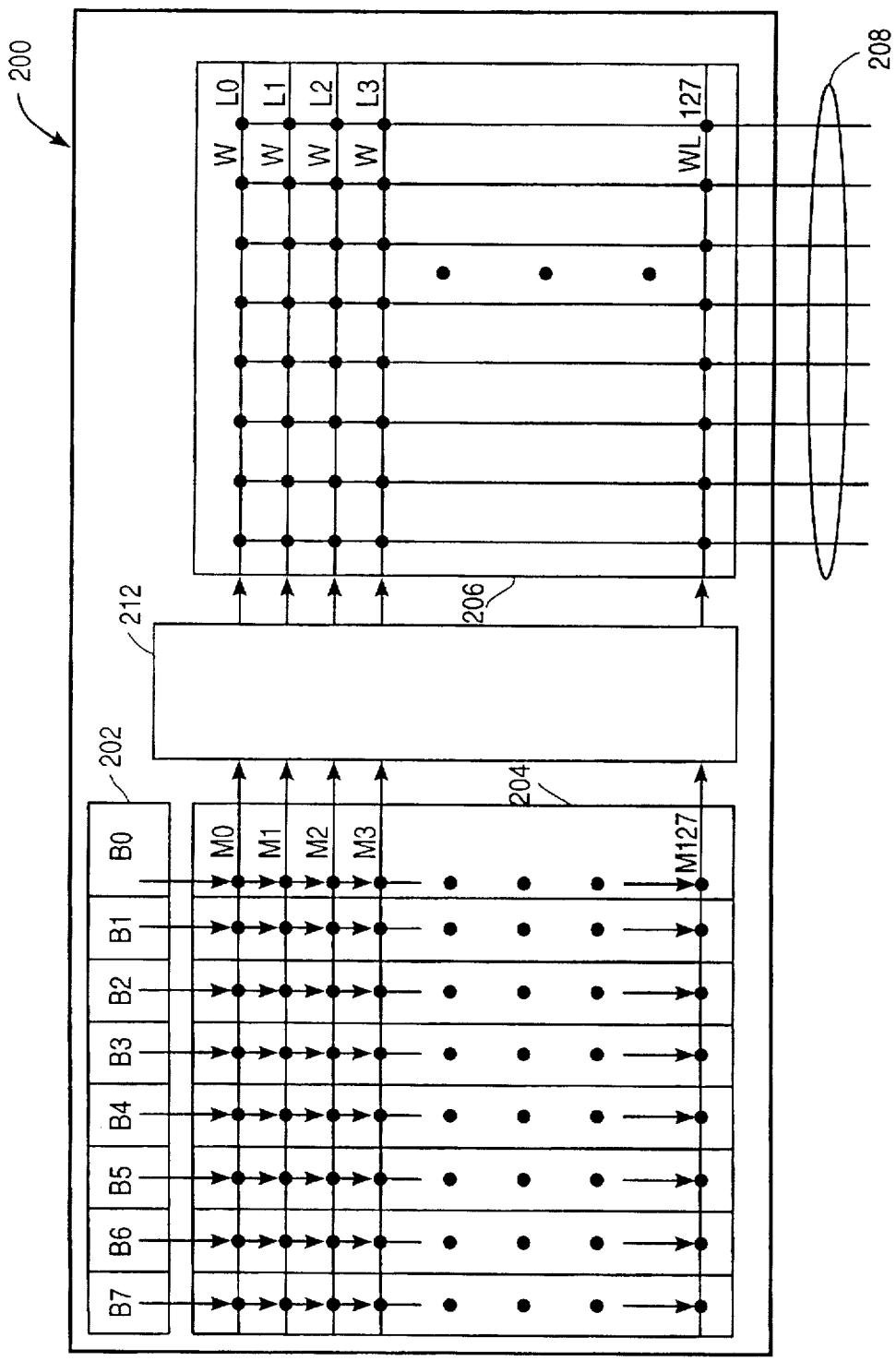
FIG_1

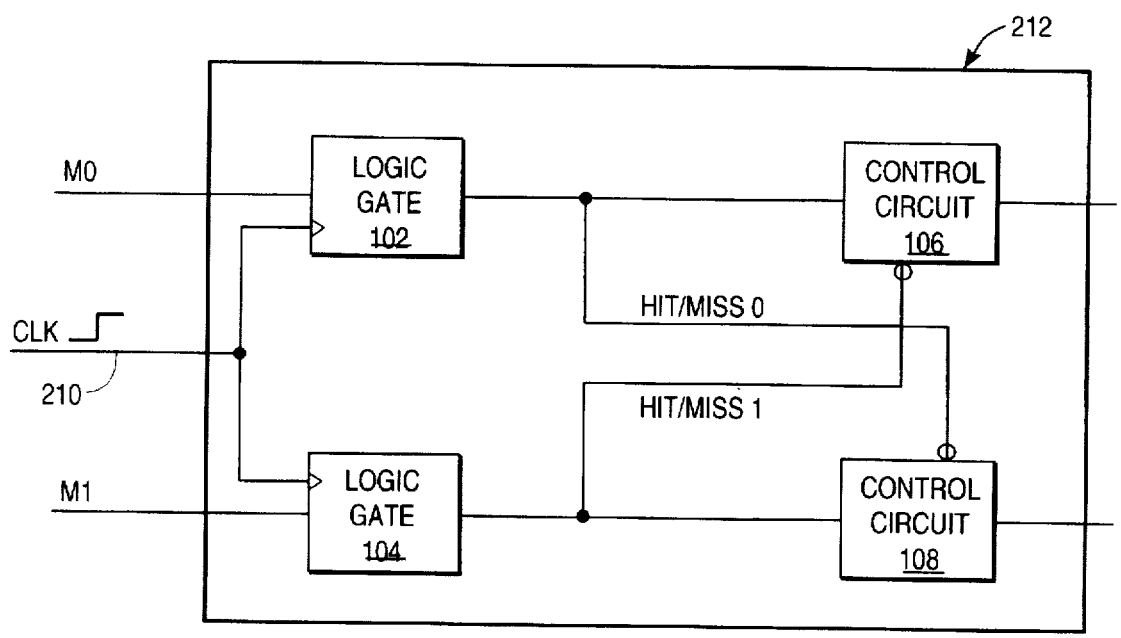
FIG_2

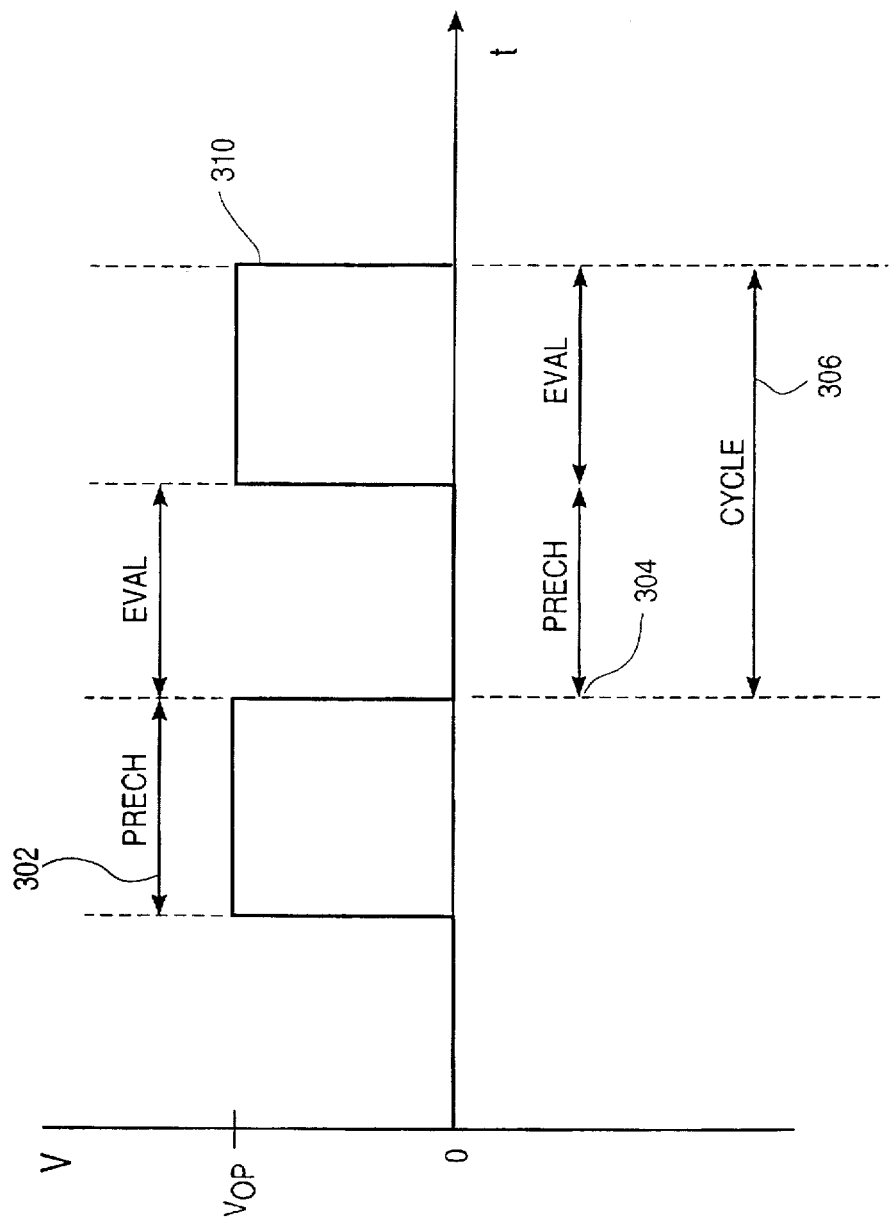
FIG_3

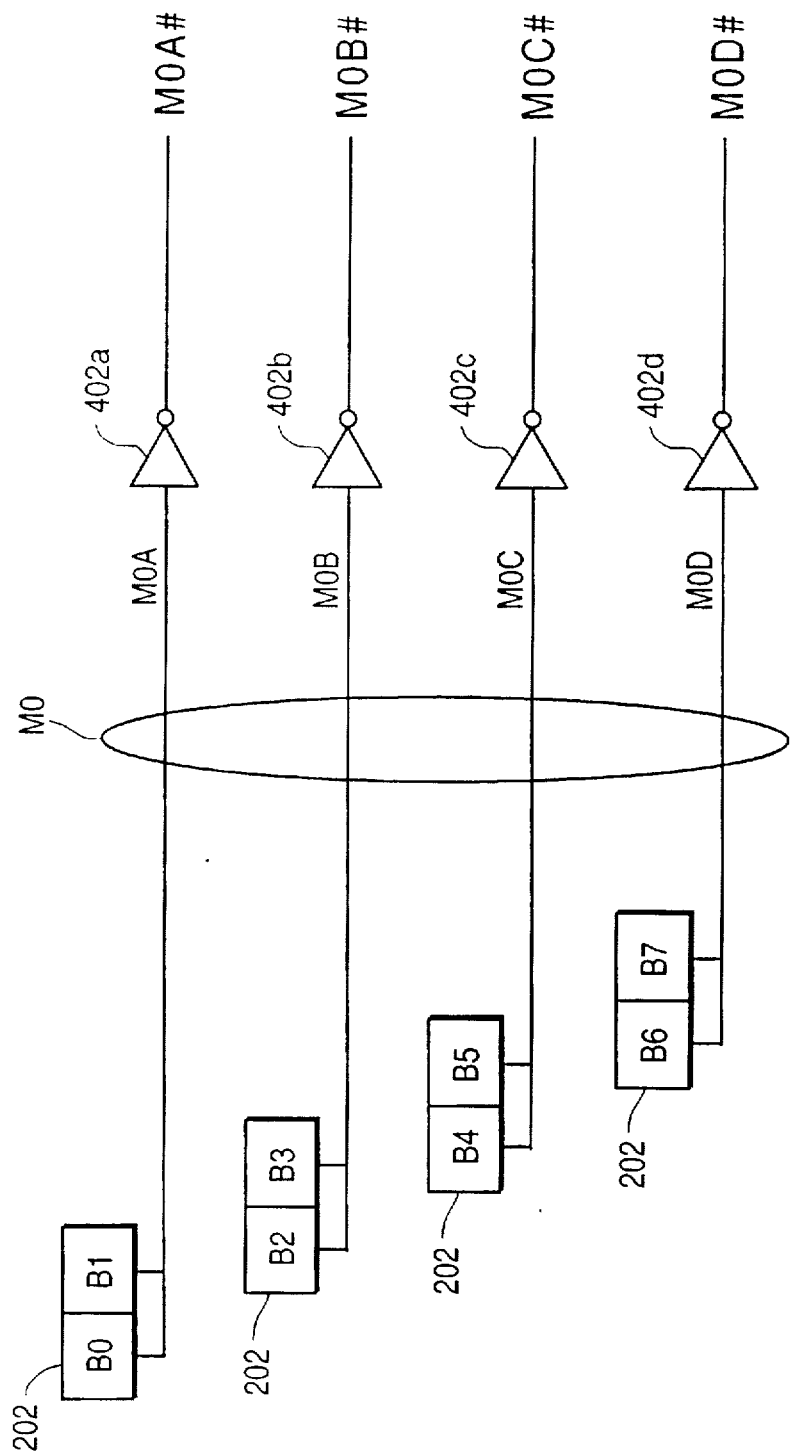
FIG_4

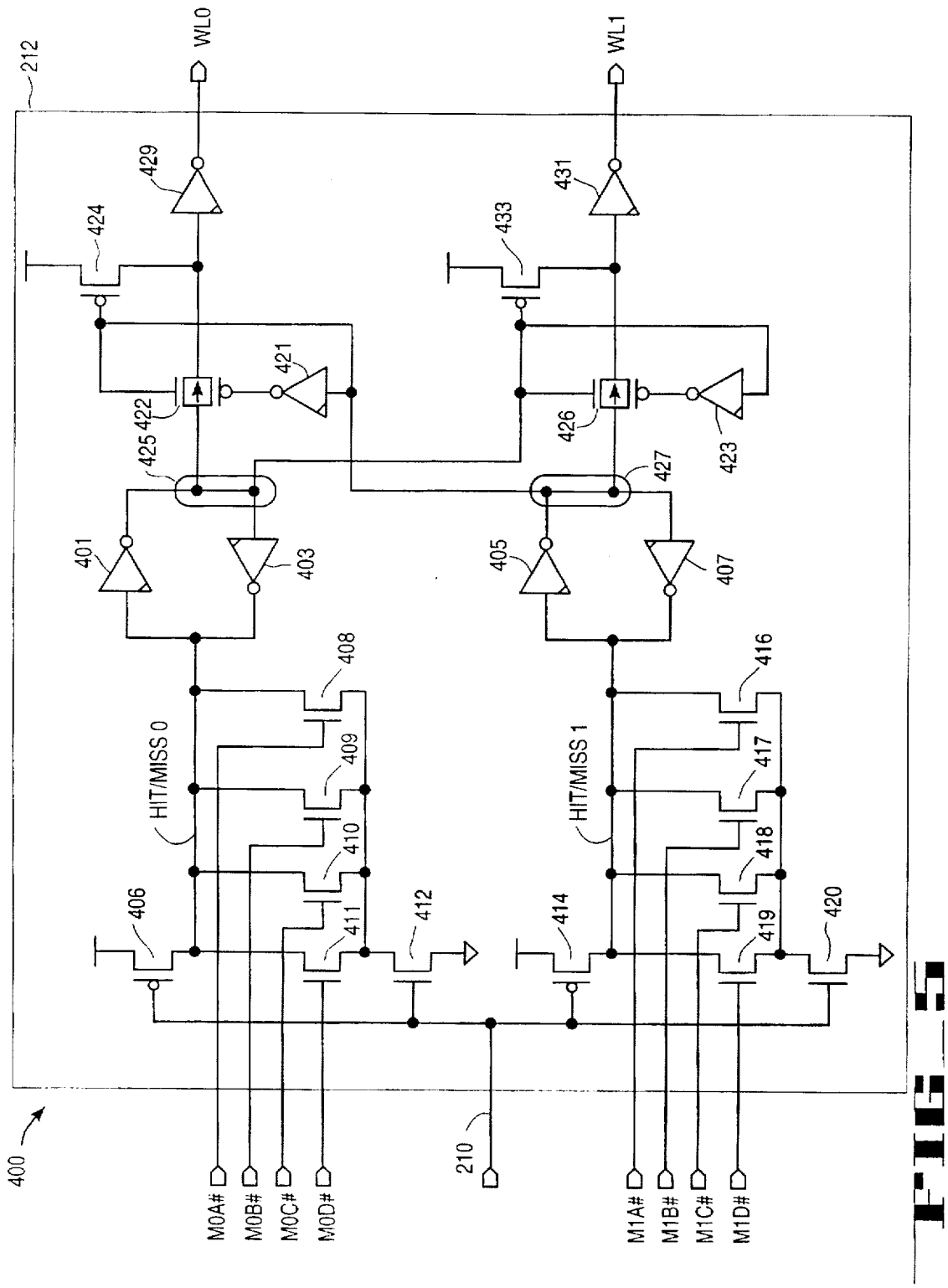
FIG_5

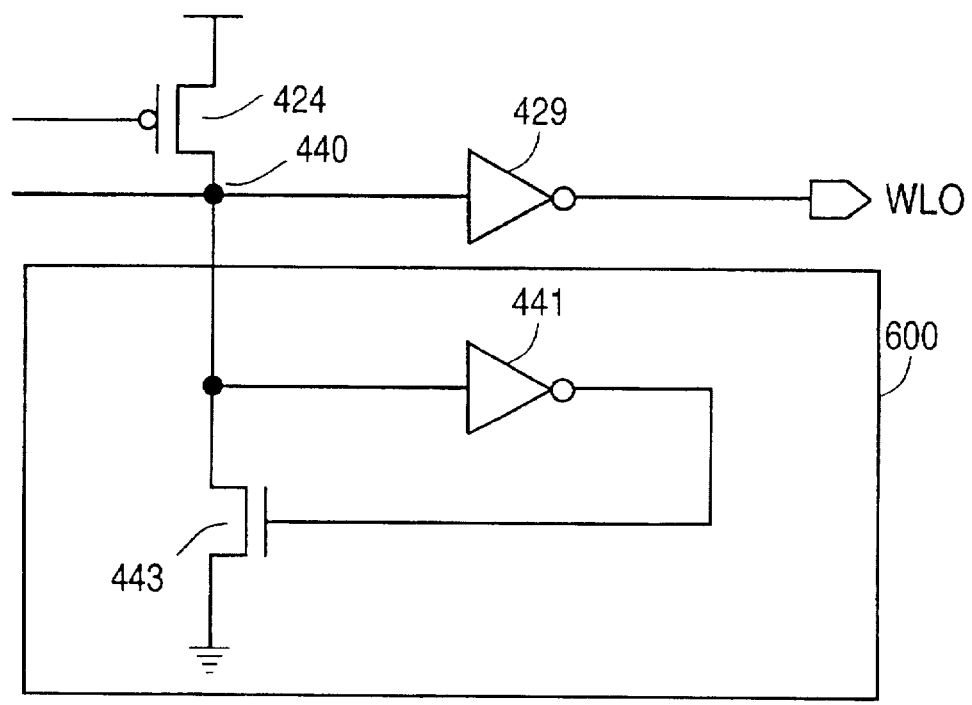
FIG_6

MUTUALLY CONTROLLED MATCH-LINE-TO-WORD-LINE TRANSFER CIRCUIT

FIELD OF THE INVENTION

The present invention relates to the field of address translation in computer systems and more particularly to address translation using a translation lookaside buffer (TLB).

BACKGROUND OF THE INVENTION

Data in computer systems is stored in memory (the term "data" is used herein to refer to both data and instructions). Memory may comprise a variety of memory devices, such as read-only memory (ROM), random access memory (RAM) and disk storage. Computer system designers and users continue to require increased memory capacity. Various methods have been developed in attempts to maximize the utilization of existing memory and to make memory access faster. One of these methods includes dividing memory into a hierarchical structure including levels with faster and slower access times. For example, faster, cache memory is used to store data used by the CPU. When the CPU accesses data using an address, the cache is first checked for the data using the address. If the data is not in the cache, the data is fetched from physical memory and stored in the cache for later use.

Another method of maximizing memory utilization includes the creation and use of virtual memory. Virtual memory was developed to allow programmers to use more physical memory than actually existed by automatically managing levels of memory hierarchy. In virtual memory systems, several programs may simultaneously operate as if each had sole access to physical memory, even though the combined memory requirements of the programs exceed available physical memory.

In typical virtual memory systems, each of several programs operating with a single CPU "thinks" it has access to the entire address range of physical memory. Because that is not really the case, any address a program addresses must be relative to local memory. These relative addresses are called virtual addresses.

In a typical virtual memory system, the processor, for example a central processing unit (CPU), generates a virtual address. In most virtual memory systems, some address translation is needed to convert the virtual address to a physical address. This translation takes CPU time. To decrease the time spent performing address translations, prior computer systems using virtual addressing employ a dedicated cache called a translation lookaside buffer (TLB) to store translated addresses. The TLB is searched for the required address before translation is initiated. If the address is found in the TLB, the translation process is skipped, thereby saving CPU time.

Typical TLBs include a content addressable memory (CAM) storing virtual address tags and a RAM storing corresponding physical addresses. As many as 128 or more virtual address tag-physical address pairs are typically stored in a TLB. A TLB search involves comparing a supplied virtual address tag to the virtual address tags in the CAM. It is possible for only one match or no matches in the CAM to occur. If the supplied virtual address tag is found in the CAM, a match occurs. On a match, a CAM match line associated with the location in which the virtual address is found indicates a hit. A hit in the CAM causes a corresponding RAM location, or word line, to output the physical address corresponding to the virtual address tag.

In view of design considerations, CAM and RAM are usually precharged to opposite states. A CAM hit is signified by a high logic level on the appropriate match line. All CAM match lines except the match line actually matched are pulled low. In the RAM, conversely, all word lines are precharged low and a hit in the CAM results in the high CAM match line causing only one word line to transition high in the RAM, that is, the word line containing the proper physical address.

The CAM and the RAM in the TLB operate with a common clock. On the high half-cycle of the clock CAM is precharging while RAM is evaluating. Similarly, on the low half-cycle of the clock, CAM is evaluating while RAM is precharging. For optimal system speed a TLB access should be completed in a single clock cycle. A TLB access can be completed in a single clock cycle when the CAM evaluating a possible match on a low half-cycle and the RAM outputting an address on the following high half-cycle. In prior TLBs, however, it is not possible to guarantee that a TLB access will be complete in one clock cycle.

In typical prior art systems using TLBs, a virtual address tag is resolved in a unit referred to as a table walker before it is passed to the CAM. The virtual address is passed to the CAM upon a clock edge of the table walker clock. Transfer of information, from results of CAM comparison to eventual output of an address from the RAM, is controlled by multiple clocks which must each meet timing requirements. Each clock event must be delayed if information to be passed is not properly set up. For example, usually the CAM is too slow to complete evaluation in one half-cycle of the clock because evaluation time is dictated by transistor response time. Therefore, clock cycles are wasted.

A possible solution is to increase the CAM transistor sizing to make the CAM faster, but the cost in integrated circuit area would be too great. Another possibility is to use a timer to control the interaction of CAM and RAM. As clock rates increase, however, allowances for process, temperature and power variations take up larger and larger percentages of the clock cycle, making it more difficult to guarantee that a timer will reach both ends of the TLB at about the same time.

What is needed then is a TLB providing faster access. As will be seen, the present invention provides a novel TLB circuit which permits TLB access to be completed in one clock cycle and reduces dependence on multiple clocks. The invention is characterized by the use of NMOS transistors and occupies a minimum of integrated circuit area.

SUMMARY OF THE INVENTION

Accordingly, it is an object of the invention to provide a TLB circuit with improved performance.

A circuit for transferring a logic value from a content addressable memory (CAM) having a plurality of match lines to a random access memory (RAM) having a plurality of word lines is described. A first logic gate has an input coupled to a first match line of the plurality of match lines, and a second logic gate has an input coupled to a second match line of the plurality of match lines. A first switch is coupled between an output of the first logic gate and a first word line, and a second switch is coupled between an output of the second logic gate and a second word line. The first switch is controlled by the output of the second logic gate such that the first switch is opened when the second match line has a second logic value and closed when the second match line has a first logic value. The second switch is controlled by the output of the first logic gate such that the second switch is opened when the first match line has the second logic value and closed when the first match line has the first logic value.

BRIEF DESCRIPTION OF THE DRAWINGS

FIG. 1 is a block diagram of a translation lookaside buffer (TLB) of the present invention;

FIG. 2 is a block diagram of an embodiment of the match-line-to-word-line circuit of the present invention;

FIG. 3 is a plot of CAM and RAM events in relationship to the TLB clock;

FIG. 4 is an illustration of one match line of the present invention divided into multiple match lines;

FIG. 5 is a circuit diagram of an embodiment of the match-line-to-word-line circuit of the present invention;

FIG. 6 is a circuit diagram of a speed-up circuit of an embodiment of the match-line-to-word-line circuit of the present invention.

DETAILED DESCRIPTION

In the following detailed description of the present invention numerous specific details are set forth in order to provide a thorough understanding of the present invention. However, it will be obvious to one the present invention may be practiced without these specific details. In other instances well known methods, procedures, components, and circuits have not been described in detail to avoid obscuring the present invention.

Referring to FIG. 1, TLB 200 includes CAM 204 and RAM 206. CAM 204 includes CAM match lines M0 through M127 for storing virtual address tags. Other embodiments could include a greater or lesser number of CAM match lines. Virtual address tag 202 is supplied upon a memory access for the purpose of searching TLB 200 for a previously translated address. For purposes of illustration, virtual address tag 202 is shown containing eight bits, B0 through B7. In actuality, virtual address tags contain many more bits. Each of the bits B0 through B7 is compared to a bit in a corresponding position on each of the CAM match lines M0 through M127. CAM match lines M0 through M127 are precharged to a high logic level. A high logic level also indicates a hit in CAM 204. If each of bits B0 through B7 match each corresponding bit in any one of CAM match lines M0 through M127, the match line corresponding to the hit will remain high while all other match lines will transition low. Only one match is found in CAM 204 on a TLB access.

RAM 206 includes word lines WL0 through WL127 corresponding to match lines M0 through M127. Other embodiments could include a greater or lesser number of word lines. Word lines WL0 through WL127 are precharged low. When a hit occurs in TLB 200, one of match lines M0 through M127 remains high while all other match lines transition low. The high match line activates the corresponding word line and causes the address of the word line to be output as output address 208. Output address 208 is shown as an eight bit address for an example. Practitioners in the art will understand that output address 208 can have many more bits than eight. Likewise, output address 208 can be a different number of bits than virtual address 202.

CAM 204 and RAM 206 share a common TLB clock signal. CAM 204 match lines M0 through M127 precharge on the high levels of the common clock signal and evaluate on the low levels of the common clock signal. RAM 206 word lines WL0 through WL127 precharge on the low levels of the common clock signal and evaluate on the high levels of the common clock signal.

FIG. 2 is a block diagram of an embodiment of the match line to word line transfer circuit 212 of the present invention. Transfer circuit 212 includes match lines M0 and M1. Similar transfer circuits are included for each consecutive pair of match lines in TLB 200. For example, match lines M2 and M3 are included in a transfer circuit such as circuit 212, as are match lines M4 and M5, and so on. Each transfer circuit 212 transfers information regarding a hit or miss in CAM 202 from CAM 202 to RAM 206.

The outputs of WL0 and WL1 are cross-controlled such that their outputs depend on the states of M1 and M0, respectively. M0 and M1 are input to clocked logic gates 102 and 104, respectively. Logic gates 102 and 104 output hit/miss signals 0 and 1, respectively, on the high level of TLB clock signal 210.

Hit/miss signals 0 and 1 indicate either a hit or a miss on match lines M0 and M1, respectively. Hit/miss signals 0 and 1 are input to control circuits 108 and 106, respectively. Hit/miss signal 0 allows control circuit 108 to pass hit/miss signal 1 to word line WL1 when hit/miss signal 0 has a high logic value. When hit/miss signal 0 has a low logic value, control circuit 108 maintains word line WL1 at the level it was during the previous clock cycle. Similarly, hit/miss signal 1 allows control circuit 106 to pass hit/miss signal 0 to word line WL0 when hit/miss signal 1 has a high logic value. When hit/miss signal 1 has a low logic value, control circuit 106 maintains word line WL0 at the level it was during the previous clock cycle. The active levels of the hit/miss signals and clock signal 210 are stated for example, but could be opposite logic levels.

Because only one TLB hit occurs during a TLB access in the embodiment of FIG. 2, only one of match lines M0 or M1 indicates a hit in a given clock cycle. According to the circuit of FIG. 2, if M0 or M1 indicate a miss (have a low logic level) on the high level of clock signal 210, the opposite hit/miss signal is passed directly to the corresponding word line, that is WL0 or WL1, respectively. Conversely, if M0 or M1 indicate a hit on the rising edge of clock signal 210, the opposite hit/miss signal cannot pass to the corresponding word line.

This arrangement of mutual control between members of match line pairs also prevents passing a of false hit indication in the situation of more than one hit in a match line pair. As described, only one line or no lines in CAM 202 will match a presented virtual address tag. When matches are erroneously indicated in both match lines of a pair, according to circuit 212, no change will occur on the word lines corresponding to the match line pair.

FIG. 3 shows the clock voltage waveform 310 of clock 210 as a function of time. Waveform 310 alternates between zero volts and operating voltage Vop. For this embodiment, logic gates 102 and 104 evaluate on the high level of clock waveform 310. CAM events 302 include a precharge event occurring during the high level of clock waveform 310, and an evaluation event occurring during the low level of clock waveform 310. RAM events 304 include a precharge event occurring during the low level of clock waveform 310, and an evaluation event occurring during the high level of clock waveform 310. A CAM evaluation event and a RAM evaluation event constitute a complete TLB access. As shown, a TLB access is complete in one clock cycle, shown as cycle 306. In the present invention, timing of clock 210 edges is not as critical to proper TLB operation as is the case in prior systems. Edges of clock 210 can arrive early (before the resolution of M0 or M1) without causing faulty operation because edges of clock 210 do not trigger evaluation events. Rather, evaluation events are controlled by the transfer circuit of the present invention, as described below with reference to FIG. 5.

FIG. 4 is an illustration of single match line M0 divided into four match lines M0A, M0B, M0C and M0D. In one embodiment of the present invention, each match line M0 through M127 is divided into sections as shown in FIG. 4 in order to reduce the driving power required to activate each match line. When address bits B0 and B1 of virtual address tag 202 match the bits in corresponding positions of match line M0, match line M0A remains in its precharged condition of a high logic level. When either of virtual address tag bits B0 or B1 do not match, match line M0A goes to a low logic level. Match lines M0B, M0C and M0D operate identically with reference to their corresponding virtual address tag bits. In this manner, a hit in match line M0 is indicated when each of match lines M0A through M0D have a high logic level. A miss in match line M0 is indicated when any one of match lines M0A through M0D has a low logic level. Inverters 402a through 402d each invert one of match lines M0A through M0D producing signals M0A# through M0D#. Thus, a hit in match line M0 is indicated by each of signals M0A# through M0D# having a low logic level. A miss in match line M0 is indicated by any one of signals M0A# through M0D# having a high logic level.

FIG. 5 is a circuit diagram of an embodiment 400 of the present invention. Embodiment 400 includes transfer circuit 212, which is shown in greater detail, with match lines M0 and M1 divided into multiple lines as described with respect to FIG. 3. Inputs M0A# through M0D# together indicate a hit or miss in match line M0 of CAM 202. Inputs M1A# through M1D# together indicate a hit or a miss in match line M1 of TLB 200. For this embodiment, similar transfer circuits 212 exist for every consecutive pair of match line sets in CAM 204. For example a similar transfer circuit exists with inputs M2a# through M2d# and M3a# through M3d#.

The operation of circuit 212 is best understood with reference to descriptions of two of three possible situations. The three possible situations are: (1) a miss in M0 and a hit in M1; (2) a hit in M0 and a miss in M1; and (3) a miss in M0 and a miss in M1. The first and third situations will be described. The second situation, as will become apparent, is like the first situation with M0 and M1 interchanged.

In the first situation, (a miss in match line M0 and a hit in match line M1), at least one of lines M0A through M0D is low. Input M0A# is connected to the gate of NMOS transistor 408, input M0B# is connected to the gate of NMOS transistor 409, input M0C# is connected to the gate of NMOS transistor 410, input M0D# is connected to the gate of NMOS transistor 411. The sources of NMOS transistors 408 through 411 are connected to hit/miss node 0. The drains of NMOS transistors 408 through 411 are connected to the source of NMOS transistor 412. The drain of NMOS transistor 412 is connected to ground potential and gate of NMOS transistor 412 is connected to clock 210. Also connected to clock 210 is the gate of PMOS transistor 406, whose source is connected to the operating voltage and whose drain is connected to hit/miss node 0.

Hit/miss node 0 can only be high when each one of inputs M0A#, M0B#, M0C# and M0D# are low or when transistor 406 is "on". Transistor 406, when "on" during the low level of clock 210, acts as a voltage pull-up for hit/miss node 0. When clock 210 transitions from low to high, transistor 406 is turned "off" and transistor 412 is turned "on", allowing transistor 408, 409, 410 and 412 to evaluate inputs M0A through M0D in the manner of a logic NOR. That is, hit/miss node 0 will be pulled low (indicating a miss in match line M0) unless each one of inputs M0A through M0D is low.

When a miss occurs in match line M0, a low logic value on hit/miss node 0 is input to inverter 401. The output of inverter 401 is connected to the input of inverter 403, whose output is connected to hit/miss node 0. Inverter 401 inverts the value on hit/miss node 0 and inverter 403 inverts the output of inverter 403 to the original hit/miss node 0 value. In this way, inverters 401 and 403 "latch" the node value and also supply positive feedback of the node value. Latching the value of hit/miss node 0 in this way for one half-cycle provides more reliable CAM operation. If the value of hit/miss node 0 were not latched, it would be possible for hit/miss node 0 to float during the evaluation half-cycle when all of transistors 408 through 411 were off, allowing possible transfer of false values due to noise, cross-coupling or other variances. Transfer circuit 212 eliminates this possibility.

The positive feedback arrangement of inverters 401 and 403 allows the voltage transition of node 425 to appear as a sharp edge. Node 425 is connected to the output of inverter 401 and the input of inverter 403.

If the value on hit/miss node 0 were not passed to the positive feedback arrangement of inverters 401 and 403, the voltage transition of the value would be characterized by the resistor/capacitor (RC) constant of the physical devices involved. If this were the case, the transition time of hit/miss node 0 could not be guaranteed and thus the value passing from the CAM to the RAM could not be guaranteed to be set up before the clock edge initiating RAM evaluation. Thus, the present invention assures that the value hit/miss node 0 is adequately set up for evaluation by RAM 206 within the same clock cycle.

Node 425 is also connected to the input of pass gate 422, as well as to the NMOS side of pass gate 426, the PMOS side of pass gate 426 through inverter 423 and the gate of PMOS transistor 433. Continuing with the example, when hit/miss node 0 is low, node 425 has a high value. A high value on node 425 causes pass gate 426 to conduct and transistor 433 to be "off". Therefore, when a miss occurs in match line M0, the logic value on node 427 is passed to the input of inverter 431. The output of inverter 431 is RAM word line WL1.

As shown in FIG. 5, the portion of circuit 212 having lines M1A through M1D as inputs is identical in design to the portion already described having lines M0A through M0D as inputs. PMOS transistor 414 provides a voltage pull up for hit/miss node 1 when clock 210 is low. When clock 210 is high NMOS transistors 416 through 420 operate as a NOR gate with respect to input M1A through M1D. A hit on match line M1 results in each of lines M1A through M1D being low. Therefore, hit/miss node 1 remains high when clock 210 transitions from low to high. After passing through inverter 405, the value on hit/miss node 1 becomes a low value on node 427. Node 427 is connected to the PMOS side of pass gate 422 through inverter 421, to the NMOS side of pass gate 422, to the gate of PMOS transistor 424, and to the input of pass gate 426. Thus, a low value on node 427 causes pass gate 422 to be nonconductive (i.e., "closed") and causes transistor 424 to be "on", pulling the input of inverter 429 high. In consequence, RAM word line WL0 is forced low, which is its precharge state. The low value on node 427 is passed through open pass gate 426 and through inverter 431 forcing RAM word line WL1 to a high logic level.

In this way, a hit is indicated in WL1 and a miss in WL0 reflecting the hit in match line 1 and the miss in match line 0. The transfer of the evaluated match line value of the CAM to the word line of the CAM takes place within one clock cycle.

As stated, the situation of a hit in match line M0 and a miss in match line M1 will not be described in detail. The values on the upper portion of circuit 212 relating to inputs M0A through M0D and the values on the lower portion of circuit 212 relating to inputs M1A through M1D are interchanged for that situation.

Finally, the situation of a miss in both of match lines M0 and M1 will be described with reference to the more detailed description of the situation of a miss in match line M0 and a hit in match line M1 (the miss/hit situation). As discussed with respect to the miss/hit situation, lines M0A through M0D are not all low. This eventually causes the value on node 425 to open pass gate 426 and shut off pull-up transistor 433. In the miss/miss situation, lines M1A through M1D also are not all low, causing the value on node 427 to open pass gate 422 and shut off pull up transistor 424. Thus, both pass gates 422 and 426 are open. The values on nodes 425 and 427 in a miss/miss situation, however, are high. Inverters 429 and 431 invert the values on nodes 425 and 427, respectively, so that word lines WL0 and WL1 both remain at their precharge (low) levels.

FIG. 6 shows a speed-up circuit 600 of an embodiment of the present invention which is used to speed up the transition of WL0 from a low value to a high value when a hit is indicated in M0. Speed-up circuit 600 is coupled to the input of inverter 429. Similar speed up circuits are coupled to the inputs of inverters preceding each word line of TLB 200 in this embodiment.

When a hit occurs in M0, the input to inverter 429, node 440, goes from a high to a low value. Node 440 is also coupled to the input to inverter 441 and to the source of NMOS transistor 443. A low value on node 440 is inverted by inverter 441 and the resultant high value turns on transistor 443, which then pulls down node 440. Thus, circuit 600 has the effect of making the transition of node 440 faster and allowing a stable value to appear on WL0 sooner.

What is claimed is:

1. A circuit for a translation lookaside buffer (TLB) comprising:

a first match line carrying a logic value indicating a first hit/miss condition in the first match line;

a second match line carrying a logic value indicating a second hit/miss condition in the second match line;

a first word line;

a second word line;

a first control means that allows activation of the second word line when the logic value on the first match line indicates a first miss condition;

a second control means that allows activation of the first word line when the logic value on the second match line indicates a second miss condition, wherein the first control means maintains the second word line in an inactive state when the logic value on the first match line indicates the first hit condition, and wherein the second control means maintains the first word line in an inactive state when the logic value on the second match line indicates the second hit condition.

2. The transfer circuit of claim 1, wherein the first match line and the second match line correspond to a first address in a content addressable memory (CAM) and a second address in the CAM, respectively, and wherein the first word line and the second word line correspond to a first address in a random access memory (RAM) and a second address in the RAM, respectively.

3. The transfer circuit of claim 1, wherein the first and second match lines are precharged to a first logic level and the first and second word lines are precharged to a second logic level.

4. The transfer circuit of claim 1, wherein the first and second control means comprise pass gates and pull up devices.

5. The transfer circuit of claim 1, further comprising a first and a second NOR means and wherein the first and second match lines each comprise a plurality of lines input to the first and second NOR means.

6. A transfer circuit comprising:

a first subcircuit that transfers a first match signal from a content addressable memory (CAM) to a random access memory (RAM) when there is a hit in a first CAM line;

a second subcircuit that transfers a second match signal from the CAM to the RAM when there is a hit in a second CAM line;

the first subcircuit being coupled to the second subcircuit such that a transfer of the first match signal is enabled by the second subcircuit when there is a miss in the second CAM line, and a transfer of the second match signal is enabled by the first subcircuit responsive to a miss in the first CAM line, the first subcircuit comprising:

a first plurality of CAM match lines coupled to gates of a corresponding first plurality of field effect devices, the first plurality of field effect devices coupled between a first node and a second node;

a clock signal line coupled to the gates of a first field effect device and a second field effect device, the first and second field effect devices being active on opposite levels of the clock signal line, the first field effect device being coupled between a first potential and the first node, the second field effect device being coupled between a second potential and the second node, the first field effect device forcing the first node to a first logic level until one of the first plurality of CAM match lines goes to the first logic level, the first node then going to the second logic level;

a first latch device coupled to the first node latching a logic level of the first node;

first control circuitry comprising:

first gate device, the input of the first gate device coupled to an output of the first latch device, the output of the first latch device coupled a first word line of the RAM;

a first word line field effect device coupled between the first word line and the first potential;

a first control node coupling the first gate device and a gate of the first word line field effect device, the logic value on the first control node determining whether the first gate device passes a logic value from the output of the first latch device to the first word line or whether the first field effect device maintains the first word line at the second logic level.

7. The transfer circuit of claim 6, wherein the first logic level on the first node indicates a miss in the first CAM line and the first logic level on the second node indicates a miss in the second CAM line.

8. The transfer circuit of claim 6, wherein the first plurality of field effect devices and the second plurality of field effect devices comprise p-junction metal oxide semiconductor (PMOS) transistors.

9. A transfer circuit comprising:

a first subcircuit that transfers a first match signal from a content addressable memory (CAM) to a random access memory (RAM) when there is a hit in a first CAM line;

a second subcircuit that transfers a second match signal from the CAM to the RAM when there is a hit in a second CAM line;

the first subcircuit being coupled to the second subcircuit such that a transfer of the first match signal is enabled by the second subcircuit when there is a miss in the second CAM line, and a transfer of the second match signal is enabled by the first subcircuit when there is a miss in the first CAM line, the second subcircuit comprising:

a second plurality of CAM match lines coupled to gates of a corresponding second plurality of field effect devices, the second plurality of field effect devices coupled between a third node and a fourth node;

a third field effect device and a fourth field effect device, the third and fourth field effect devices being active on opposite levels of the clock, the third field effect device being coupled between the first potential and the third node, the fourth field effect device being coupled between the second potential and the fourth node, the gates of the third and fourth field effect devices being coupled to the clock line, the third field effect device forcing the third node to the first logic level until one of the second plurality of CAM match lines goes to the first logic level, the third node then going to the second logic level;

a second latch device coupled to the first node latching a logic level of the first node;

second control circuitry comprising:

a second gate device, the input of the first gate device coupled to an output of the second latch device, the output of the second latch device coupled a second word line of the RAM;

a second word line field effect device coupled between the second word line and the first potential;

a second control node coupling the second gate device and a gate of the second word line field effect device, the logic value on the second control node determining whether the first gate device passes a logic value from the output of the second latch device to the second word line or whether the second field effect device maintains the second word line at the second logic level.

10. The transfer circuit of claim 9, wherein the output of the first latch device is coupled to the second control node and the output of the second latch device is coupled to the first control node.

11. The transfer circuit of claim 9, wherein the first field effect device and the third field effect device comprise n-junction metal oxide semiconductor (NMOS) transistors, and wherein the second field effect device and the fourth field effect device comprise (PMOS) transistors.

12. A method for transferring signals from a content addressable memory (CAM) of a translation lookaside buffer (TLB) to a random access memory (RAM) of the TLB comprising the steps of:

receiving a first plurality of match signals on a first plurality of match lines from the CAM;

receiving a second plurality of match signals on a second plurality of match lines from the CAM;

transitioning a first word line of the RAM from a precharge value to a value that allows information corresponding to the first word line to be output when any one of the second plurality of match lines indicates a miss;

transitioning a second word line of the RAM from a precharge value to a value that allows information corresponding to the second word line to be output when any one of the first plurality of match lines indicates a miss;

maintaining the first word line at the precharge logic value when each of the second plurality of match lines indicates a hit;

maintaining the second word line at the precharge logic value when each of the first plurality of match lines indicates a hit;

latching a first logic value in a first positive feedback device when each of the first plurality of match lines indicates a hit;

latching the first logic value in a second positive feedback device when each of the second plurality of match lines indicates a hit;

latching a second logic value in the first positive feedback device when any one of the first plurality of match lines indicates a miss;

latching the second logic value in the second positive feedback device when any one of the second plurality of match lines indicates a miss.

13. The method of claim 12, further comprising the steps of:

opening a first pass gate with the second logic value in the second positive feedback device;

opening a second pass gate with the second logic value in the first positive feedback device;

closing the first pass gate with the first logic value in the second positive feed back device;

closing the second pass gate with the first logic level in the first positive feedback device.

* * * * *

UNITED STATES PATENT AND TRADEMARK OFFICE
CERTIFICATE OF CORRECTION

PATENT NO.    : 5,893,929
DATED         : April 13, 1999
INVENTOR(S)   : Shadan et al.

It is certified that error appears in the above-identified patent and that said Letters Patent is hereby corrected as shown below:

Column 3,
Line 26, delete "it will be obvious to one".

Column 6,
Line 33, delete "dock" and insert -- clock --.

Signed and Sealed this

Twenty-seventh Day of January, 2004

JON W. DUDAS
*Acting Director of the United States Patent and Trademark Office*